(12) United States Patent
Makino et al.

(10) Patent No.: US 8,680,564 B2
(45) Date of Patent: Mar. 25, 2014

(54) GROUP III NITRIDE SEMICONDUCTOR LIGHT-EMITTING DEVICE

(75) Inventors: Hiroaki Makino, Kiyosu (JP); Yoshiki Saito, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 13/554,796

(22) Filed: Jul. 20, 2012

(65) Prior Publication Data

US 2013/0020608 A1    Jan. 24, 2013

(30) Foreign Application Priority Data

Jul. 21, 2011   (JP) .................................. 2011-159506

(51) Int. Cl.
*H01L 33/00* (2010.01)

(52) U.S. Cl.
USPC .......... 257/99; 257/79; 257/98; 257/E33.062; 257/E33.063; 257/E33.064; 257/E33.065

(58) Field of Classification Search
CPC .............................. H01L 33/62; H01L 33/486
USPC ................ 257/99, 79, E33.064, 98, E33.062, 257/E33.063, E33.065
See application file for complete search history.

(56) References Cited

U.S. PATENT DOCUMENTS

| | | | |
|---|---|---|---|
| 7,078,735 B2 * | 7/2006 | Shono et al. ................... 257/98 |
| 7,485,897 B2 | 2/2009 | Seong et al. | |
| 7,518,153 B2 * | 4/2009 | Usuda et al. ................... 257/94 |
| 8,053,793 B2 * | 11/2011 | Park et al. ....................... 257/95 |
| 2005/0199895 A1 | 9/2005 | Seong et al. | |
| 2006/0273324 A1 * | 12/2006 | Asai et al. ...................... 257/79 |
| 2007/0228385 A1 * | 10/2007 | Cao et al. ....................... 257/79 |
| 2009/0039373 A1 * | 2/2009 | Saito et al. ..................... 257/98 |
| 2009/0124030 A1 | 5/2009 | Seong et al. | |
| 2009/0166666 A1 * | 7/2009 | Yao et al. ..................... 257/101 |
| 2012/0001196 A1 * | 1/2012 | Choi et al. ...................... 257/76 |

FOREIGN PATENT DOCUMENTS

| JP | 2005-260245 A | 9/2005 |
| JP | 2006-080469 A | 3/2006 |

OTHER PUBLICATIONS

Keuch, "Surfactants in Semiconductor Epitaxy," AIP Conference Proceedings, 2007, vol. 916 Issue 1, p. 288-306.*

* cited by examiner

*Primary Examiner* — Matthew W Such
*Assistant Examiner* — Samuel Lair
(74) *Attorney, Agent, or Firm* — McGinn Intellectual Property Law Group, PLLC

(57) ABSTRACT

A Group III nitride semiconductor light-emitting device exhibiting reduced contact resistance between a p contact layer and an ITO electrode. The Group III nitride semiconductor light-emitting device has an AlGaN dot-like structure on the p contact layer, and an ITO electrode on the p contact layer and the dot-like structure. The dot-like structure has a structure in which a plurality of AlGaN dots are discretely distributed on the top surface of the p contact layer. The dot-like structure is bonded to oxygen, and oxygen increases on an interface between the p contact layer and the ITO electrode.

19 Claims, 3 Drawing Sheets

GROUP III NITRIDE SEMICONDUCTOR LIGHT-EMITTING DEVICE

BACKGROUND OF THE INVENTION

1. Field of the Invention

The present invention relates to a Group III nitride semiconductor light-emitting device exhibiting reduced contact resistance between a p contact layer and an ITO electrode.

2. Background Art

In recent years, there has been an expanding demand for general illumination applications of Group III nitride semiconductor light-emitting devices, and high-power light-emitting devices are being developed. Every year, the driving current is increasing with the development of high-power light-emitting devices. Therefore, the power consumption is remarkably increased due to resistance, causing reduction in light emission performance. To avoid this, the resistance of light-emitting devices must be reduced.

Most of Group III nitride semiconductor light-emitting devices currently produced are of a lateral conductive face-up type or flip-chip type. In the face-up type device, an ITO transparent electrode is formed on almost the entire top surface of the p contact layer. In the flip-chip type device, a reflecting electrode of high-reflectivity metal such as Ag or its alloy is formed on almost the entire top surface of the p contact layer. To reduce the resistance of light-emitting devices, the contact resistance between the p contact layer and the electrode may be reduced. Improved light emission performance and uniform light emission distribution can be expected by reducing the contact resistance.

Japanese Patent Application Laid-Open (kokai) No. 2006-80469 or 2005-260245 discloses a method for reducing the contact resistance between a p contact layer and an electrode.

Japanese Patent Application Laid-Open (kokai) No. 2006-80469 discloses that a contact area with the p contact layer is increased by forming a concave and convex pattern on the top surface of the p contact layer. The concave and convex pattern can also improve the light extraction performance. The concave and convex pattern can be formed by crystal growth under the conditions that three-dimensional growth is dominant. The conditions that three-dimensional growth is dominant include growing at a low temperature, decreasing the hydrogen concentration in a growth atmosphere, increasing the Al composition ratio, and doping with Si. Alternatively, the concave and convex pattern may be formed by selective etching or selective growth.

Japanese Patent Application Laid-Open (kokai) No. 2005-260245 shows a Group III nitride semiconductor light-emitting device having a lattice-like metal layer on a p cladding layer, and a transparent ohmic contact layer formed of transparent conductive oxide on the p cladding layer and the metal layer. Such a structure can reduce the contact resistance.

However, even with the method disclosed by Japanese Patent Application Laid-Open (kokai) No. 2006-80469 or 2005-260245, the contact resistance between the p contact layer and the ITO electrode is not sufficiently reduced, and further reduction technique is desired.

The inventors of the present invention considered, from various experiment results, that high contact resistance between the p contact layer and the ITO electrode was caused due to lack of oxygen on an interface between the p contact layer and the ITO electrode. The present invention is derived from this consideration, and realizes a Group III nitride semiconductor light-emitting device exhibiting reduced contact resistance between the p contact layer and the ITO electrode by a method different from Japanese Patent Application Laid-Open (kokai) No. 2006-80469 or 2005-260245.

SUMMARY OF THE INVENTION

In view of the foregoing, an object of the present invention is to provide a Group III nitride semiconductor light-emitting device exhibiting reduced contact resistance between a p contact layer and an ITO electrode.

In a first aspect of the present invention, there is provided a Group III nitride semiconductor light-emitting device having a p contact layer formed of p-type Group III nitride semiconductor, and an ITO transparent electrode on the p contact layer, wherein at least one selected from a group consisting of a dot-like, island-like, and mesh-like structure, each being formed of Group III nitride semiconductor comprising Al, is provided on the top surface of the p contact layer, which is also an interface between the p contact layer and the transparent electrode.

The material of the structure may be undoped or p-type doped with a p-type impurity such as Mg, as long as it is a Group III nitride semiconductor comprising Al (i.e. AlGaN, AlInN, AlGaInN, and AlN). Although it may be n-type doped with an n-type impurity such as Si, undoped or p-type material is more desirable. It may be doped with anti-surfactant such as Si, which promotes three-dimensional growth. When doping with Mg, the Mg concentration is preferably $1 \times 10^{21}/\text{cm}^3$ or less. It is because when the Mg concentration is higher than $1 \times 10^{21}/\text{cm}^3$, crystallinity of the structure is degraded. The material of the structure is particularly preferably AlGaN. AlGaN is superior in controllability, reproducibility, and crystallinity than other materials such as AlInN. When AlGaN is used, the Al composition ratio to the number of moles of the total Group III atoms is preferably, greater than 0 mol % and 50 mol % or less. That is $0 < 100x \leq 50$, in $Al_xGa_{1-x}N$. Hereinafter the Al composition ratio is defined as Al mol percent when the mol percent of the total Group III atoms is 100 mol %. When the Al composition ratio falls within this range, the structure with better reproducibility and controllability can be formed. More preferably, the Al composition ratio is 15 mol % to 30 mol %, further preferably, 20 mol % to 25 mol %.

The structure may have at least one of a dot-like shape, an island-like shape, and a mesh-like shape. In other words, the structure may have any shape as long as Group III nitride semiconductor comprising Al discretely or dispersively exists on the top surface of the p contact layer, and the entire top surface is not covered. When the structure has a dot-like shape or a mesh-like shape, a dot shape or a mesh shape is, for example, pyramid, conoid, rectangular column, circular column, truncated pyramid, truncated conoid, or hemisphere.

The area occupied by the structure is preferably greater than 0% and 50% or less of the entire top surface of the p contact layer. When the occupied area is 0%, an insufficient amount of oxygen is supplied to an interface between the p contact layer and the transparent electrode, and the contact resistance cannot be sufficiently reduced. When the occupied area is greater than 50%, the contact area between the p contact layer and the transparent electrode is reduced, thereby the contact resistance increases, which is not desirable. More preferably, the occupied area of the structure is greater than 0% and 20% or less, more preferably, 10% to 15%.

At least one of a dot-like, island-like and mesh-like structure can be formed on the p contact layer by growing Group III nitride semiconductor comprising Al on the p contact layer for a short time under the conditions that three dimensional growth is dominant. The conditions that three-dimensional growth is dominant include, for example, growing at a low temperature, reducing the hydrogen concentration, increasing the Al composition ratio, or doping with anti-surfactant such as Si. A dot-like, island-like, or mesh-like structure is formed by controlling at least one or more of these conditions. Alternatively, such a structure may be formed by selective etching or selective growth.

Moreover, the structure preferably has a height of 0.5 nm to 5 nm. When the height falls within this range, the contact resistance between the p contact layer and the transparent electrode can be sufficiently reduced. More preferably, the height is 0.5 nm to 2.5 nm, more preferably 0.5 nm to 1.0 nm.

The p contact layer may be formed of any material as long as the material is a p-type Group III nitride semiconductor. The material of the p contact layer is preferably p-GaN or p-InGaN. When it is P-GaN, Mg concentration or crystallinity can be easily controlled. When it is p-InGaN, the work function of p-InGaN is closer to that of the transparent electrode, and the contact resistance can be further reduced.

The p contact layer preferably has a Mg concentration of $1.0\times10^{19}/cm^3$ to $1.0\times10^{21}/cm^3$. When the Mg concentration is lower than $1.0\times10^{19}/cm^3$, the contact resistance cannot be sufficiently reduced. When the Mg concentration is higher than $1.0\times10^{21}/cm^3$, crystallinity of the p contact layer is degraded. More preferably, the Mg concentration is $1.0\times10^{20}/cm^3$ to $1.0\times10^{21}/cm^3$. Preferably, the p contact layer has a thickness of 5 nm to 100 nm. When the thickness is smaller than 5 nm, the p contact layer is difficult to be formed in a film. When the thickness is larger than 100 nm, the resistance of the p contact layer increases, which is not desirable. Moreover, the p contact layer may be formed of multiple layers with different Mg concentrations or In composition ratios.

The transparent electrode preferably has a thickness of 100 nm to 200 nm. As used herein, "the thickness of the transparent electrode" encompasses a thickness vertically measured from the bottom surface of the transparent electrode on the p contact layer 15 to the top surface of the transparent electrode. When the thickness falls within this range, uniform light emission is achieved due to improved current dispersion, and the drive voltage is sufficiently reduced.

A second aspect of the present invention is drawn to a specific embodiment of the Group III nitride semiconductor light-emitting device according to the first aspect, wherein the structure is formed of AlGaN.

A third aspect of the present invention is drawn to a specific embodiment of the Group III nitride semiconductor light-emitting device according to the first or second aspect, wherein in the structure an Al composition ratio to the numbers of moles of the total group III atoms is greater than 0 mol % and 50 mol % or less.

A fourth aspect of the present invention is drawn to a specific embodiment of the Group III nitride semiconductor light-emitting device according to any one of the first to third aspect, wherein the area occupied by the structure of the entire top surface of the p contact layer is greater than 0% and 50% or less.

The present invention can reduce the contact resistance between the p contact layer and the transparent electrode. This is attributed to the fact that Al contained in the structure is bonded to oxygen, and oxygen increases on an interface between the p contact layer and the transparent electrode, thereby the contact resistance is reduced.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Specific embodiments of the present invention will next be described with reference to the drawings. However, the present invention is not limited to the embodiments.

Embodiment 1

Figure 1:
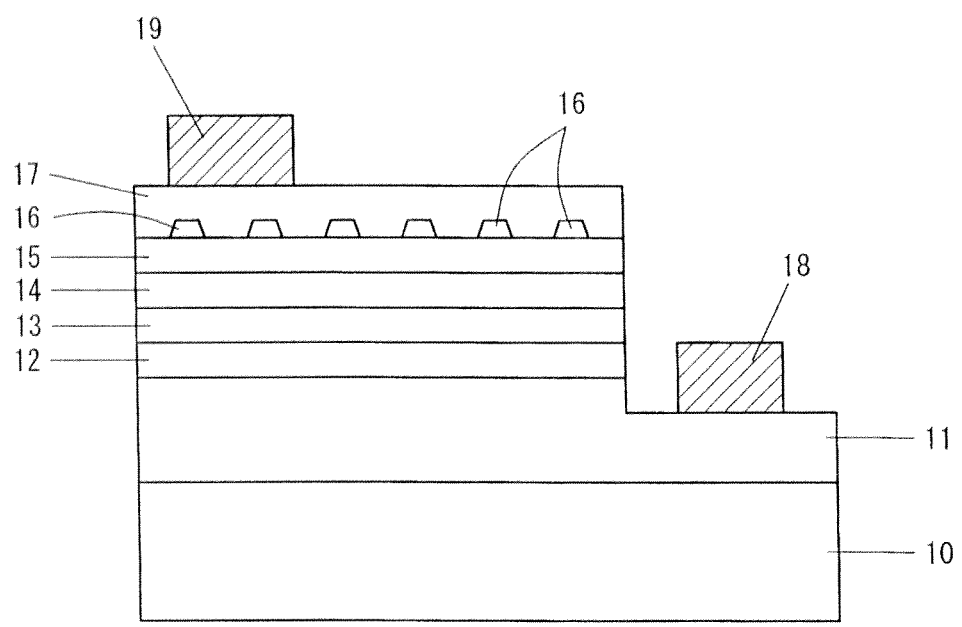
FIG. 1 is the configuration of a Group III nitride semiconductor light-emitting device according to Embodiment 1.

FIG. 1 shows the configuration of a Group III nitride semiconductor light-emitting device according to Embodiment 1. The Group III nitride semiconductor light-emitting device according to Embodiment 1 includes a sapphire substrate 10; an n contact layer 11, an n cladding layer 12, a light-emitting layer 13, a p cladding layer 14, and a p contact layer 15, which are sequentially deposited on the sapphire substrate 10. Moreover, a trench having a depth extending from the top surface of the p-type contact layer 15 to the n contact layer 11 is formed, and an n electrode 18 is formed on the n-type contact layer 11 exposed at the bottom of the trench. A dot-like structure 16 is formed on the p contact layer 15, in which a plurality of AlGaN dots are discretely distributed. An ITO electrode 17 is formed on the p contact layer 15 and the dot-like structure 16. A p electrode 19 is formed on the ITO electrode 17.

On the surface of the sapphire substrate 10, which surface is at the n contact layer 11 side, a dot-like, stripe-like concave and convex pattern may be formed to improve the light extraction performance. The sapphire substrate may be replaced with a growth substrate formed from, for example, SIC, Si, ZnO, spinel, GaN, or $Ga_2O_3$.

The n contact layer 11 is formed of n-GaN having a Si concentration of $1\times10^{18}/cm^3$ or more. To reduce the contact resistance with the n electrode 16, the n contact layer 11 may be formed of multiple layers with different Si concentrations.

The n cladding layer 12 has a superlattice structure formed by repeatedly depositing layer units, each comprising an undoped AlGaN layer, and a Si-doped n-GaN layer, which are sequentially deposited.

An ESD layer may be formed between the n contact layer 11 and the n cladding layer 12 to improve electrostatic breakdown voltage of the device. For example, the ESD layer has a three-layer structure comprising a first ESD layer, a second ESD layer, and a third ESD layer, the layers being sequentially deposited on the n contact layer 11. The first ESD layer has pits (pit density: $1\times10/cm^2$ or less) on the surface at the light-emitting layer 13 side thereof. The first ESD layer is formed of GaN having a thickness of 200 nm to 1000 nm, and a Si concentration of $1\times10^{16}$ to $5\times10^{17}/cm^3$. The second ESD layer has pits (pit density: $2\times10^8/cm^2$ or more) on the surface at the light-emitting layer 13 side thereof. The second ESD layer is formed of GaN having a thickness of 50 nm to 200 nm, and a carrier concentration of $5\times10^{17}/cm^3$ or less. The third ESD layer is formed of GaN having a characteristic value, as defined by the product of Si concentration ($/cm^3$) and thickness (nm), of $0.9\times10^{20}$ to $3.6\times10^{20}$ ($nm/cm^3$). Such a structure of the ESD layer can improve electrostatic breakdown voltage, emission performance, and reliability, and reduce the current leakage.

The light-emitting layer 13 has a MQW structure in which an undoped InGaN well layer and an undoped AlGaN barrier layer are alternately deposited in a repeated manner. A capping layer formed of AlGaN having an Al composition ratio below that of the barrier layer may be formed between the well layer and the barrier layer at the same growth temperature as employed for the well layer. When such a capping layer is provided, light emission performance can be improved, since the capping layer prevents release of In from the well layer during heating for formation of the barrier layer. A layer formed of undoped GaN and undoped AlGaN may be formed between the light-emitting layer 13 and the p cladding layer 14 to prevent diffusion of Mg from the p cladding layer 14 to the light-emitting layer 13.

The p cladding layer 14 has a structure formed by repeatedly depositing layer units, each including a p-InGaN layer and a p-AlGaN layer which are sequentially deposited. The initial layer of the p cladding layer 14, which is in contact with the light-emitting layer 13, is the p-InGaN layer, and the final layer of the p cladding layer 14, which is in contact with the p contact layer 15, is the p-AlGaN layer. The overall thickness of the p cladding layer 14 is 32.9 nm. Mg is employed as a p-type impurity.

The p contact layer 15 is formed of p-GaN doped with Mg. The Mg concentration is preferably $1.0\times10^{19}/cm^3$ to $1.0\times10^{21}/cm^3$. When the Mg concentration is lower than $1.0\times10^{19}/cm^3$, the contact resistance cannot be sufficiently reduced. When the Mg concentration is higher than $1.0\times10^{21}/cm^3$, crystallinity of the p contact layer is degraded. More preferably, the Mg concentration is $1.0\times10^{20}/cm^3$ to $1.0\times10^{21}/cm^3$. Preferably, the p contact layer has a thickness of 5 nm to 100 nm. When the thickness is smaller than 5 nm, the p contact layer cannot be formed in a film. When the thickness is larger than 100 nm, the resistance of the p contact layer increases, which is not desirable.

The p contact layer 15 is not limited to p-GaN, or may be p-InGaN. The work function of p-InGaN is closer to that of ITO, and the contact resistance between the p contact layer 15 and the ITO electrode 17 can be further reduced. The p contact layer 15 may be formed of multiple layers with different Mg concentrations or In composition ratios to further reduce the contact resistance with the ITO electrode 17.

A concave and convex pattern may be formed on the top surface of the p contact layer 15. This improves the light extraction performance, and the contact area with the ITO electrode 17 increases, thereby the contact resistance can be further reduced.

A dot-like structure 16 has a structure in which a plurality of dots formed of undoped AlGaN having an Al composition ratio of greater than 0 mol % and 50 mol % or less are discretely distributed on the p contact layer 15. The Al composition ratio is preferably 15 mol % to 30 mol %, more preferably, 20 mol % to 25 mol %. A dot is not limited to AlGaN, or may be a Group III nitride semiconductor containing Al (AlGaInN, AlInN, and AlN) or p-type semiconductor doped with Mg. When doping with Mg, the Mg concentration is preferably $1\times10^{21}/cm^3$ or less. A structure is not limited to a dot-like shape, or may be an island-like shape or a mesh-like shape. That is, the structure may have any shape as long as AlGaN is discretely and dispersively distributed on the top surface of the p contact layer 15, and the entire top surface is not covered. When the structure has a dot-like shape or a mesh-like shape, a dot shape or a mesh shape may be, for example, pyramid, conoid, rectangular column, circular column, truncated pyramid, truncated conoid, or hemisphere.

The area occupied by the dot-like structure 16 is preferably greater than 0% and 50% or less of the entire top surface of the p contact layer 15. When the occupied area is 0%, an insufficient amount of oxygen is supplied to an interface between the p contact layer 15 and the ITO electrode 17, and the contact resistance cannot be sufficiently reduced. When the occupied area is greater than 50%, the contact area between the p contact layer 15 and the ITO electrode 17 becomes small, and the contact resistance increases, which is not desirable. More preferably, the occupied area of the dot-like structure 16 is preferably greater than 0% and 20% or less, more preferably, 10% to 15% of the entire top surface of the p contact layer 15.

Moreover, the structure preferably has a height of 0.5 nm to 5 nm. When the height falls within this range, the contact resistance between the p contact layer and the transparent electrode can be sufficiently reduced. The height is more preferably 0.5 nm to 2.5 nm, further preferably 0.5 nm to 1.0 nm.

In the Group III nitride semiconductor light-emitting device according to Embodiment 1, an AlGaN dot-like structure 16 is provided between the p contact layer 15 and the ITO electrode 17 to reduce the contact resistance between the p contact layer 15 and the ITO electrode 17. This is attributed to the fact that Al of the dot-like structure 16 is bonded to oxygen, and oxygen is supplied to an interface between the p contact layer 15 and the ITO electrode 17.

Next will be described processes for producing the Group III nitride semiconductor light-emitting device according to Embodiment 1 with reference to FIGS. 2A to 2D.

Figure 2A:
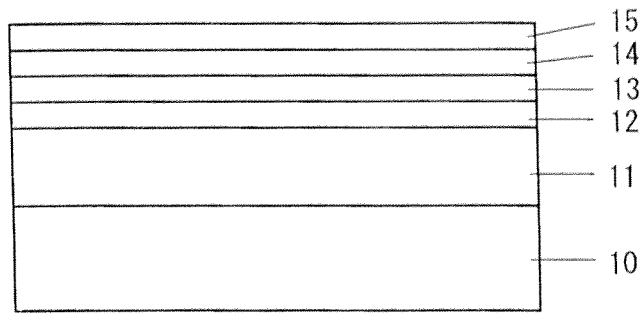
FIGS. 2A to 2D are sketches showing processes for producing the Group III nitride semiconductor light-emitting device according to Embodiment 1.

Firstly, a sapphire substrate 10 is heated in a hydrogen atmosphere for thermal cleaning, to thereby remove impurity deposits from the surface of the sapphire substrate 10. Then, an AlN buffer layer (not illustrated) is formed on the sapphire substrate 10 by MOCVD at 400° C. Thereafter, on the buffer layer, by MOCVD, an n contact layer 11, an n cladding layer 12, a light-emitting layer 13, a p cladding layer 14, and a p contact layer 15 are sequentially formed (FIG. 2A). The p contact layer 15 is formed at 1000° C. to 1020° C. The gases employed are as follows: ammonia gas ($NH_3$) as a nitrogen source; TMG as a Ga source; TMI as an In source; TMA as an Al source; silane ($SiH_4$) as an n-type dopant gas; $Cp_2Mg$ as a p-type dopant gas; and hydrogen or nitrogen ($H_2$ or $N_2$) as a carrier gas.

Figure 2B:
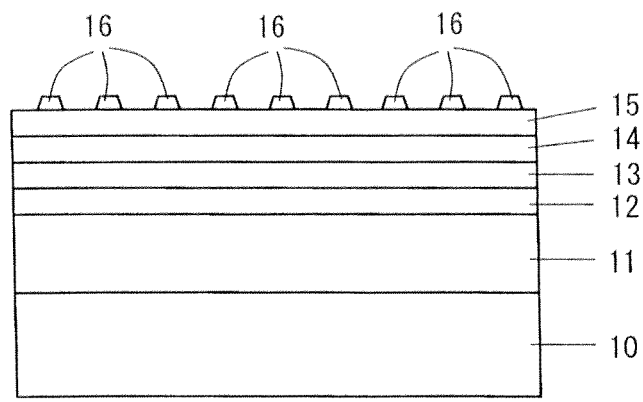

Subsequently, on the p contact layer 15, by MOCVD, an AlGaN dot-like structure 16 is formed (FIG. 2B). The aforementioned raw material gases and carrier gas are employed. The dot-like structure is formed by crystal growth for a short time under the conditions that three dimensional growth is dominant. One of the conditions is to grow crystal at a low temperature. Specifically, crystal is preferably grown at 800° C. to 850° C. One of other conditions is to reduce the hydrogen concentration in a growth atmosphere. Specifically, the supply amount of carrier gas of $H_2$ is preferably reduced. One of other conditions is to increase the Al composition ratio of AlGaN. Specifically, the Al composition ratio to the total number of moles of Al and Ga is preferably 20 mol % to 25 mol %. One of other conditions is to dope with anti-surfactant such as Si. AlGaN is grown in a dot-like shape on the p contact layer 15 by controlling at least one of these conditions.

The dot-like structure 16 may be formed by selectively etching or selectively growing AlGaN.

Figure 2C:
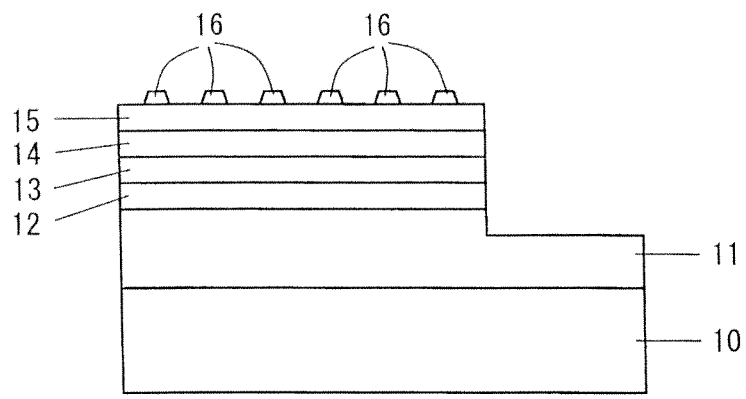

Next, after the p-type conduction of the p cladding layer 14 and the p contact layer 15 was obtained by thermal treatment to activate Mg, a trench extending from the top surface of the p contact layer 15 to the n contact layer 11 is formed by dry etching (FIG. 2C).

Figure 2D:
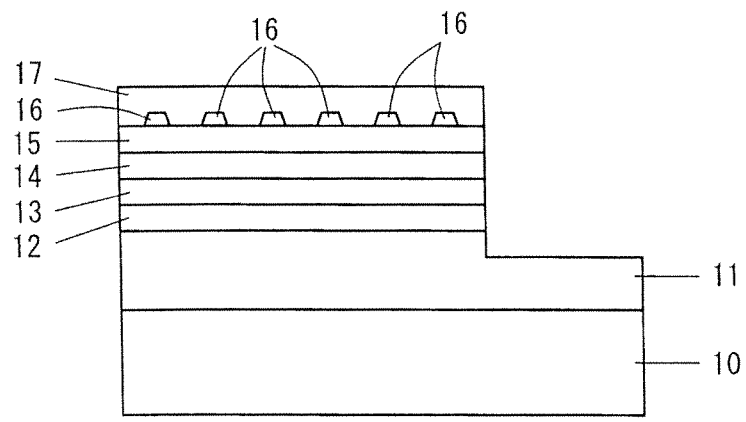

An ITO electrode 17 is formed by deposition or sputtering on the p contact layer 15 and the dot-like structure 16, and thereafter ITO is crystallized by baking at 650° C. to 700° C. (FIG. 2D).

Alternatively after the ITO electrode 17 was formed, trench reaching the n contact layer 11 may be formed.

A p electrode 18 on the ITO electrode 17, an n electrode on the n contact layer exposed at the bottom of the trench are respectively formed by deposition, and alloyed by thermal treatment. Thus, the Group III nitride semiconductor light-emitting device shown in FIG. 1 is produced.

Figure 3:
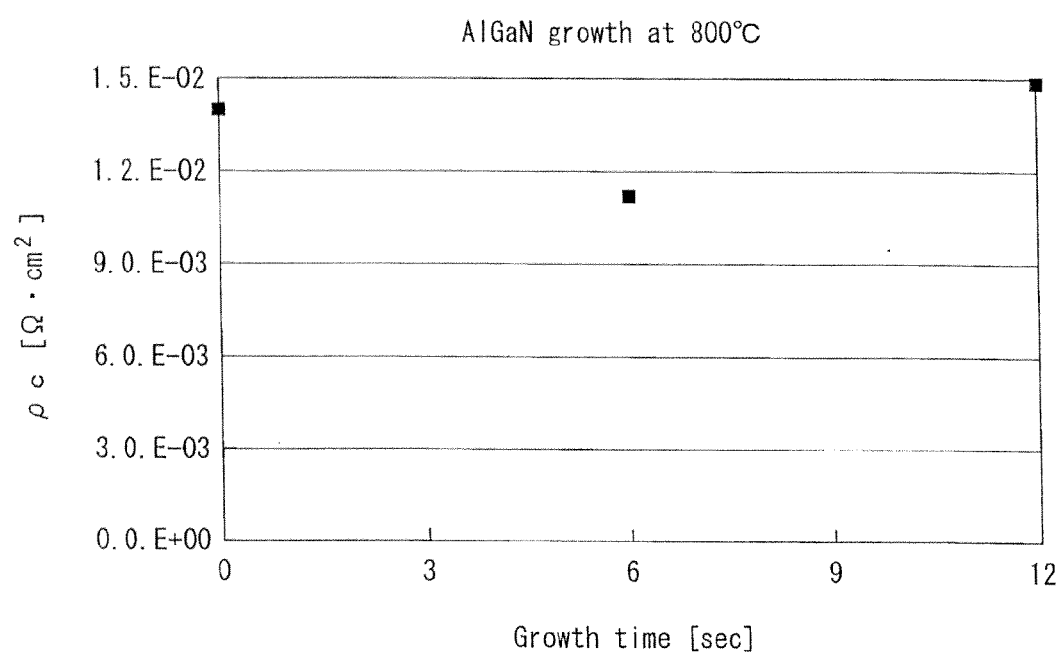
FIG. 3 is a graph showing a comparison of contact resistance measurement results.

FIG. 3 is a graph showing the measurement results of the contact resistance ρc ($\Omega \cdot cm^2$) between the p contact layer 15 and the ITO electrode 17 in the Group III nitride semiconductor light-emitting device according to Embodiment 1. The growth temperature of AlGaN is 800° C., the pressure is normal pressure, the Al composition ratio is 22 mol %, and the growth time is 6 sec. Under the conditions, AlGaN is grown in a dot-like shape on the p contact layer 15, and a dot-like structure 16 is formed. When the growth time for comparison is 0 sec. (when AlGaN is not grown) and 12 sec., the contact resistance ρc was measured. As is clear from FIG. 3, the contact resistance ρc was reduced by approximately 20% when the growth time was 6 sec. compared to when the growth time was 0 sec. Therefore, from the measurement results of FIG. 3, it was found that when a dot-like structure 16 was formed between the p contact layer 15 and the ITO electrode 17, the contact resistance ρc could be reduced compared to when it was not formed. Moreover, when the growth time was 12 sec., the contact resistance ρc was slightly increased compared to when the growth time was 0 sec. This is attributed to the fact that AlGaN is formed in a film instead of a dot-shape, which covers the top surface of the p contact layer, resulting in a reduced direct contact area or no direct contact area between the p contact layer 15 and the ITO electrode 17.

A characteristic feature of the present invention resides in a Group III nitride semiconductor light-emitting device having an AlGaN dot-like structure 16 on a p contact layer 15, and an ITO electrode 17 on the p contact layer 15 and the dot-like structure 16. Other structure is not limited to the embodiments, and any known structures can be employed.

The Group III nitride semiconductor light-emitting device produced by the method of the present invention can be employed in, for example, an illumination apparatus.

What is claimed is:

1. A Group III nitride semiconductor light-emitting device, comprising:
   a p contact layer comprising at least one selected from a group consisting of GaN and InGaN and an ITO transparent electrode on the p contact layer,
   wherein at least one structure selected from a group consisting of a dot-like, an island-like, and a mesh-like structure comprising a Group III nitride semiconductor comprising Al is formed by a crystal growth on a top surface of the p contact layer, which is an interface between the p contact layer and the transparent electrode.

2. A Group III nitride semiconductor light-emitting device according to claim 1, wherein the at least one structure comprises AlGaN.

3. A Group III nitride semiconductor light-emitting device according to claim 1, wherein an Al composition ratio of the at least one structure to a number of moles of a total Group III atoms is greater than 0 mol % and less than or equal to 50 mol %.

4. A Group III nitride semiconductor light-emitting device according to claim 2, wherein an Al composition ratio of the at least one structure to a number of moles of a total Group III atoms is greater than 0 mol % and less than or equal to 50 mol %.

5. A Group III nitride semiconductor light-emitting device according to claim 1, wherein an area occupied by the at least one structure is greater than 0% and less than or equal to 50% of an entire top surface of the p contact layer.

6. A Group III nitride semiconductor light-emitting device according to claim 2, wherein an area occupied by the at least one structure is greater than 0% and less than or equal to 50% of an entire top surface of the p contact layer.

7. A Group III nitride semiconductor light-emitting device according to claim 3, wherein an area occupied by the at least one structure is greater than 0% and less than or equal to 50% of an entire top surface of the p contact layer.

8. A Group III nitride semiconductor light-emitting device according to claim 4, wherein an area occupied by the at least one structure is greater than 0% and less than or equal to 50% of an entire top surface of the p contact layer.

9. A Group III nitride semiconductor light-emitting device according to claim 1, wherein the at least one structure has a height of 0.5 nm to 5 nm.

10. A Group III nitride semiconductor light-emitting device according to claim 1, wherein the at least one structure is formed by a three dimensional growth.

11. A Group III nitride semiconductor light-emitting device according to claim 1, wherein the at least one structure is doped with an anti-surfactant.

12. A Group III nitride semiconductor light-emitting device according to claim 3, wherein the at least one structure has a height of 0.5 nm to 5 nm.

13. A Group III nitride semiconductor light-emitting device according to claim 5, wherein the at least one structure has a height of 0.5 nm to 5 nm 14. A Group III nitride semiconductor light-emitting device according to claim 3, wherein the at least one structure is formed by a three dimensional growth.

15. A Group III nitride semiconductor light-emitting device according to claim 5, wherein the at least one structure is formed by a three dimensional growth.

16. A Group III nitride semiconductor light-emitting device according to claim 3, wherein the at least one structure is doped with an anti-surfactant.

17. A Group III nitride semiconductor light-emitting device according to claim 5, wherein the at least one structure is doped with an anti-surfactant.

18. A Group III nitride semiconductor light-emitting device according to claim 1, wherein the at least one structure comprises a three dimensionally grown structure.

19. A Group III nitride semiconductor light-emitting device according to claim 1, wherein a bottom surface of the at least one structure is disposed on an uppermost surface of the p contact layer.

* * * * *